(12) United States Patent  (10) Patent No.: US 8,807,770 B2
Didat et al.  (45) Date of Patent: Aug. 19, 2014

(54) APPLIANCE USER INTERFACE HAVING REVERSE MOUNT LEDS

(75) Inventors: Mark A. Didat, Floyds Knob, IN (US); Steven Michael Recio, Louisville, KY (US); Michael Wuttikorn Ekbundit, Mount Washington, KY (US)

(73) Assignee: General Electric Company, Schenectady, NY (US)

( * ) Notice: Subject to any disclaimer, the term of this patent is extended or adjusted under 35 U.S.C. 154(b) by 269 days.

(21) Appl. No.: 13/360,954

(22) Filed: Jan. 30, 2012

(65) Prior Publication Data

US 2013/0194780 A1 Aug. 1, 2013

(51) Int. Cl.
*F21V 33/00* (2006.01)
*A47L 15/42* (2006.01)
*H05K 1/18* (2006.01)

(52) U.S. Cl.
CPC ............ *A47L 15/4293* (2013.01); *H05K 1/183* (2013.01)
USPC ............................................ 362/85; 362/458

(58) Field of Classification Search
CPC  F21V 33/00; F21V 33/0044; F21W 2131/30; F21W 2131/305; F21W 2131/307; F21W 2131/403; H05K 1/00; H05K 1/183; G09F 13/00; G09F 13/005; G09F 13/04; G09F 13/0404; G09F 13/20; G09F 13/22; A47L 15/4293
USPC ......... 362/23–30, 85, 97.1–97.3, 249.02, 458
See application file for complete search history.

(56) References Cited

U.S. PATENT DOCUMENTS

2010/0218565 A1\* 9/2010 Wan et al. ..................... 68/13 R
2011/0185609 A1   8/2011 Miedema et al.

\* cited by examiner

*Primary Examiner* — Jason Moon Han
(74) *Attorney, Agent, or Firm* — Dority & Manning, P.A.

(57) ABSTRACT

A system and method of displaying appliance information to a user is provided. Reverse mount LEDS may be used in a seven segment configuration and correlating to any other icon or indicator. The reverse mount LEDs may be mounted on single sided printed circuit board to form an appliance user display.

15 Claims, 4 Drawing Sheets

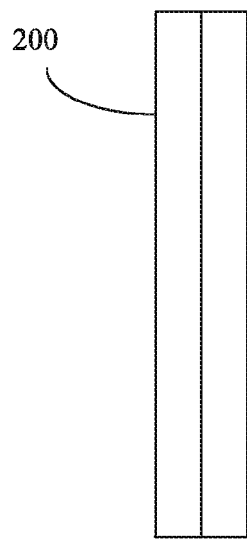 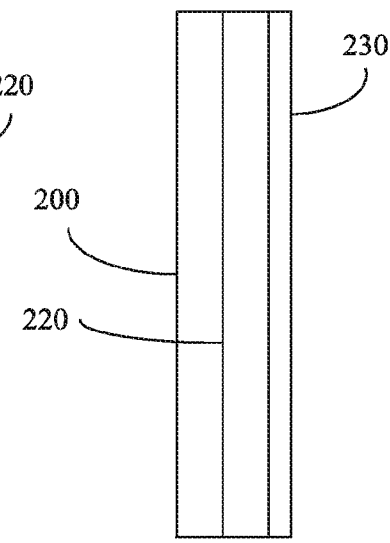 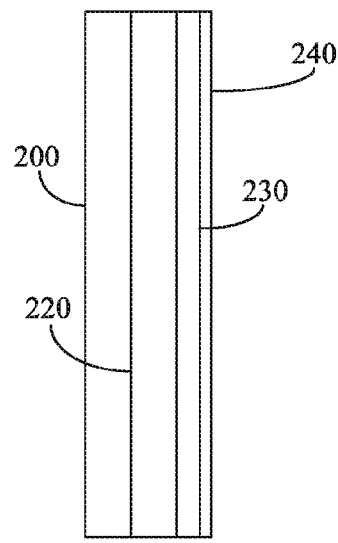
FIG. 5     FIG. 6     FIG. 7
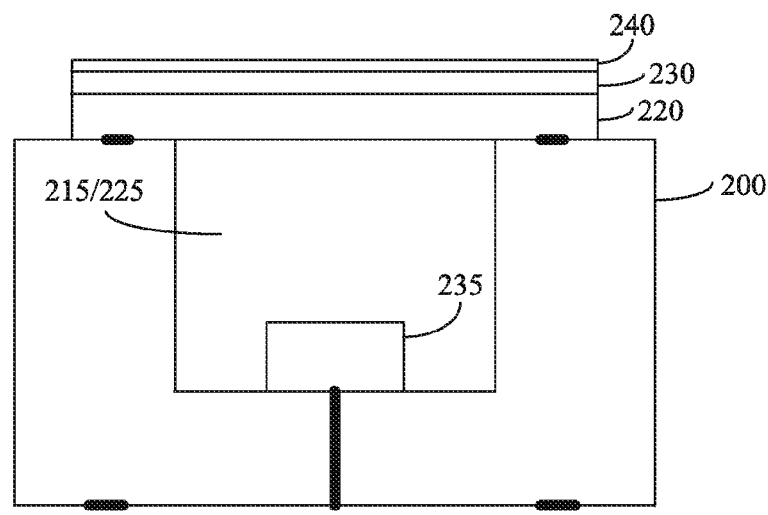
FIG. 8

APPLIANCE USER INTERFACE HAVING REVERSE MOUNT LEDS

FIELD OF THE INVENTION

The present disclosure relates to user interface of an appliance and more particularly to a system and method of displaying information to a user using reverse mount light emitting diodes.

BACKGROUND OF THE INVENTION

Conventional user interfaces for appliances include mechanical switches, pushbuttons, indicator lights, clock display modules, potentiometers and/or electronic controls. Generally, numerous device elements can be used to communicate numerical and non-numerical information.

One conventional user interface includes a seven segment display module for communicating any numerical value. For example in a range cooktop, the seven-segment display may display the clock value, a timer value and/or a temperature value. In a washing machine, dryer or dishwasher, the seven segment display may indicate the amount of time remaining in a cycle. In addition to a seven segment display, conventional user interface further include thru-hole light emitting diodes (LEDs) to communicate any other information that is not number dependent. For example, in a cooktop which burner is activated, still hot, or an indication of oven activation. In a washing machine, dryer or dishwasher, the selected cycle or temperature may be communicated by a thru-hole LED. This configuration of a user interface is undesirable because the seven segment display module has a large footprint that increases the size of the overall user interface and two the different elements increase the manufacturing time and costs.

Another conventional user interface replaces the seven segment display and through-hole LEDs with a liquid crystal display (LCD). All user information is communicated by the LCD. This configuration of a user interface is undesirable because it increases the programming requirements and draws more power. In addition, when this type of display becomes inoperable, the entire appliance may be inoperable.

Therefore, a need exists for a system and method of displaying information to a user that overcomes the above mentioned disadvantages. A user interface that could be manufactured using the same elements for the number information as well as any other information communicated to the user would be useful. In addition, it would be advantageous to use reverse mount LEDs to improve design flexibility, reliability and reduce the size and cost of the user display.

BRIEF DESCRIPTION OF THE INVENTION

Aspects and advantages of the invention will be set forth in part in the following description, or may be obvious from the description, or may be learned through practice of the invention.

One aspect of the present disclosure is directed to an appliance. The appliance includes a cabinet and a user interface coupled to the cabinet. The user interface includes a numerical display having a seven-segment arrangement and an indicator that communicates non-numerical information. The numerical display and the indicator have the same type of light emitting device.

In some embodiments of the appliance, the light emitting device is a reverse mount light emitting device.

In some embodiments of the appliance, the user interface further includes a light module, a diffuser screen, and an IDO film.

In some embodiments of the appliance, the display and indicator are mounted on a single-sided printed circuit board.

In some embodiments of the appliance, the light emitting devices are mounted on a component side of the printed circuit board.

In some embodiments of the appliance, the appliance further includes a plurality of non-numerical indicators.

Another aspect of the present disclosure is directed to a user interface of an appliance. The user interface of the appliance includes a printed circuit board, a numerical display including a plurality of light emitting devices, and an indicator including a light emitting device.

In some embodiments of the user interface, the numerical display light emitting devices and the indicator light emitting device are the same.

In some embodiments of the user interface, the light emitting device is a reverse mount light emitting device.

In some embodiments of the user interface, the user interface further includes a light module, a diffuser screen, and an IDO film.

In some embodiments of the user interface, the printed circuit board is a single-sided printed circuit board.

In some embodiments of the user interface, the numerical display light emitting devices and the indicator light emitting device are mounted on a component side of the printed circuit board.

Another aspect of the present disclosure is directed to a method of manufacturing a user interface of an appliance. The method includes boring a plurality of holes in a printed circuit board corresponding to a numerical display and a non-numerical indicator. The method includes mounting a light emitting device in each of the holes of the printed circuit board. The method includes disposing a light guide on the circuit board.

In some embodiments of the method, the light emitting devices are reverse mount light emitting devices.

In some embodiments of the method, the method further comprises disposing a diffuser screen on the light guide module.

In some embodiments of the method, the method further comprises disposing an IDO film on the diffuser screen.

In some embodiments of the method, the light emitting devices corresponding to the numerical display and non-numerical indicator are the same.

In some embodiments of the method, the holes may be partially or fully bored through the printed circuit board.

In some embodiments of the method, the light emitting devices are mounted on a component side of the printed circuit board.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 5 provides a partial, cross-sectional view illustrating an exemplary embodiment of a method of manufacturing an appliance user interface.

FIG. 6 provides a partial, cross-sectional view illustrating an exemplary embodiment of a method of manufacturing an appliance user interface.

FIG. 7 provides a partial, cross-sectional view illustrating an exemplary embodiment of a method of manufacturing an appliance user interface.

FIG. 8 provides a partial, cross-sectional view illustrating an exemplary embodiment of the present invention.

DETAILED DESCRIPTION OF THE INVENTION

Figure 1:
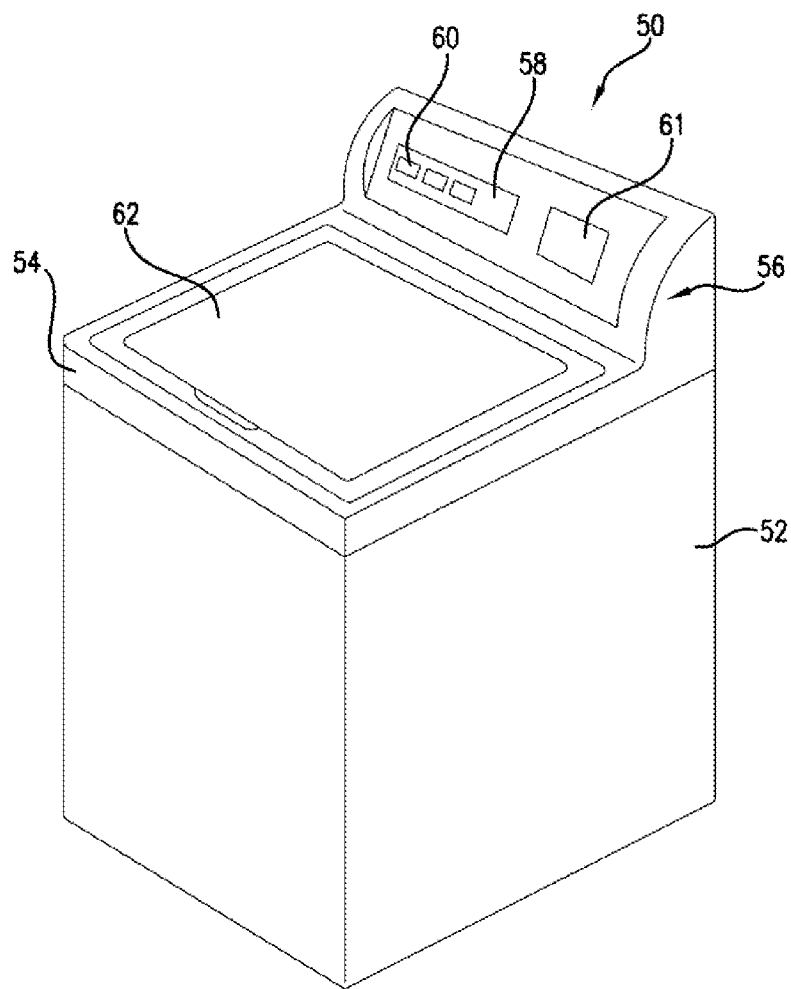
FIG. 1 provides a front, perspective view of an exemplary washing machine appliance of the present disclosure.

The present invention relates to a system and method of displaying appliance information to a user. Reverse mount LEDS may be used in a seven segment configuration and correlating to any other icon or indicator. The reverse mount LEDs may be mounted on single sided printed circuit board to form an appliance user display.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

FIG. 1 illustrates one embodiment of a washing machine of the present invention. However, other household appliances are contemplated with this invention, such as a cooktop, a dryer, a dishwasher or any other appliance that has a user interface. In FIG. 1, washing machine 50 includes a cabinet having sidewalls 52 and a top cover 54 and a door or lid 62 mounted to cover 54. A backsplash 56 extends from cover 54, and a control panel 58 including a plurality of input selectors 60 is coupled to backsplash 56. For example, in one embodiment, a display 61 indicates selected features, a countdown timer, and/or other items of interest to machine users.

The elements of the user interface may be configured in numerous ways. Control panel 58, input selectors 60, and display 61 may collectively form a user interface for communication and operator selection of machine cycles and features. Alternatively, only display 61 could form the user interface or any combination of elements provided that display 61 is included. The present invention is not limited to any specific configuration or arrangement of the particular elements of the user interface.

Figure 2:
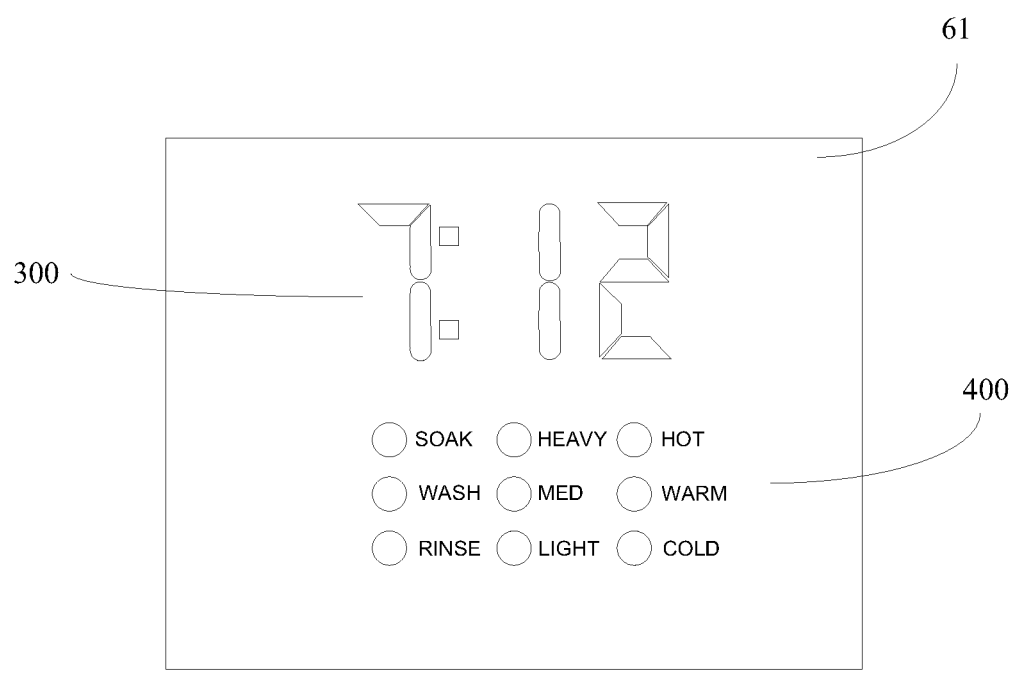
FIG. 2 provides a front, perspective view of an exemplary embodiment of the present disclosure.

As illustrated in FIG. 2, display 61 includes a numeric display portion 300 and a non-numeric display portion 400. Numeric display 300 communicates information relating to numbers such as time remaining, clock function or temperature. Non-numeric display 400 communicates any other information that may be relevant for the appliance. For example, in a washing machine, the speed, water temperature, cycle may be provided. In other appliances, other non-numeric information may be communicated.

Figure 3:
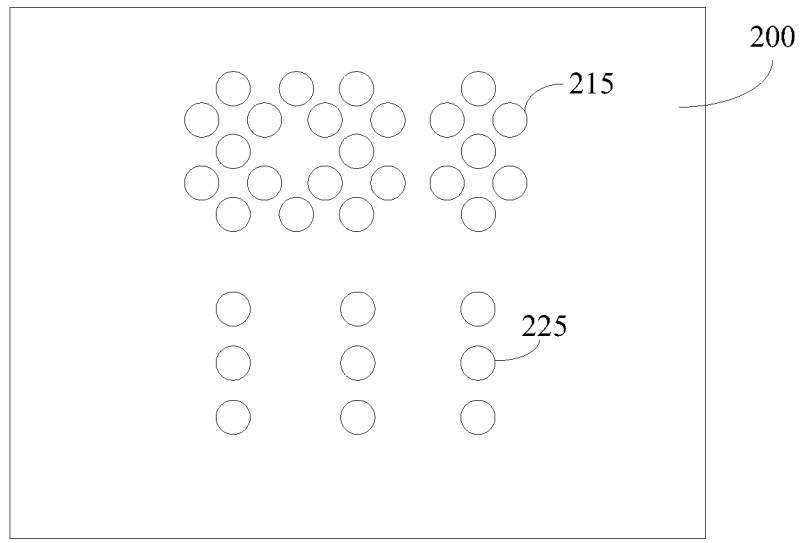
FIG. 3 provides a front, perspective view illustrating an exemplary embodiment of a method of manufacturing an appliance user interface.
Figure 4:
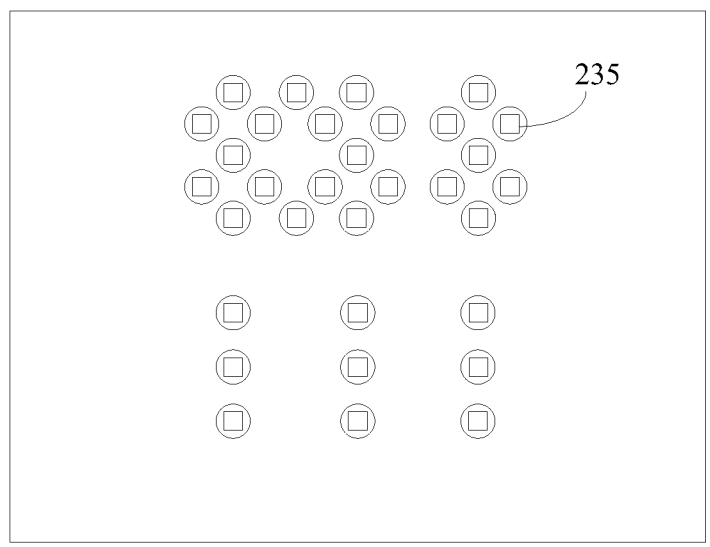
FIG. 4 provides a front, perspective view illustrating an exemplary embodiment of a method of manufacturing an appliance user interface.

Display 61 may be manufactured as illustrated in FIGS. 3-7. In FIG. 3 a plurality of holes are formed in a printed circuit board (PCB) 200 corresponding to the numeric display 215 and the non-numeric display 225. The PCB may be a single sided such as a CEM-1 or any other type of PCB. Holes 215 and 225 may be formed completely through PCB 200 or they may be formed partially through PCB 200, such as 40-60% thickness. While only holes and devices associated with the present invention are discussed, one of ordinary skill would recognize that other devices and corresponding holes in the PCB are included, such as the circuitry for control, input, temperature sensing, etc.

Light emitting devices 235 may be disposed and mounted in the holes 215 and 225. Light emitting devices 235 may be light emitting diodes (LED) such as reverse mount LEDs or organic LEDs.

FIG. 5 provides a partial, cross-sectional view illustrating an exemplary embodiment of a method of manufacturing an appliance user interface. FIG. 5 depicts the printed circuit board 200. A light guide 220 can be disposed upon on the printed circuit board 200.

FIG. 6 provides a partial, cross-sectional view illustrating an exemplary embodiment of a method of manufacturing an appliance user interface. A diffuser screen 230 can be disposed upon the light guide module 220.

FIG. 7 provides a partial, cross-sectional view illustrating an exemplary embodiment of a method of manufacturing an appliance user interface. An IDO film 240 can be disposed on the diffuser screen 230.

FIG. 8 provides a partial, cross-sectional view illustrating an exemplary embodiment of the present invention. A light emitting device 235 is disposed within a partially bored hole 215/225. Holes 215 and 225 may be formed completely through PCB 200 or they may be formed partially through PCB 200.

A light guide 220 can be disposed upon on the printed circuit board 200. A diffuser screen 230 can be disposed upon the light guide module 220. An IDO film 240 can be disposed on the diffuser screen 230.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A home appliance, comprising:
   a cabinet; and
   a user interface for the home appliance coupled to the cabinet, wherein said user interface includes:
   a single-sided printed circuit board, wherein a plurality of holes have been bored through the single-sided printed circuit board;
   a plurality of reverse-mount light emitting diodes mounted onto a first side of the single-sided printed circuit board, wherein the plurality of reverse-mount light emitting diodes are positioned so as to respectively shine light through the plurality of holes;

a light guide adjacent to a second side of the single-sided printed circuit board;

a diffuser screen adjacent to the light guide; and a film disposed upon the diffuser screen.

2. The home appliance, as in claim 1, wherein the first side of the single-sided printed circuit board comprises a component side of the printed circuit board.

3. The home appliance, as in claim 1, wherein at least a portion of the plurality of reverse-mount light emitting diodes serve as a plurality of non-numerical indicators.

4. The home appliance of claim 1, wherein the plurality of holes have been bored through the single-sided printed circuit board to form a plurality of seven-segment displays.

5. The home appliance of claim 1, wherein the kitchen appliance comprises a dishwasher.

6. The home appliance of claim 1, wherein the plurality of holes have been bored through the single-sided printed circuit board to form a numeric display portion and a non-numeric display portion.

7. A user interface of a home appliance comprising:

a single-sided printed circuit board within the home appliance, wherein a plurality of holes have been bored through the single-sided printed circuit board;

a plurality of reverse-mount light emitting diodes mounted onto a first side of the single-sided printed circuit board, wherein the plurality of reverse-mount light emitting diodes are positioned so as to respectively shine light through the plurality of holes;

a light guide adjacent to a second side of the single-sided printed circuit board;

a diffuser screen adjacent to the light guide; and a film disposed upon the diffuser screen.

8. The user interface, as in claim 7, wherein the first side of the single-sided printed circuit board comprises a component side of the printed circuit board.

9. The user interface of claim 7, wherein at least a portion of the plurality of reverse-mount light emitting diodes serve as a plurality of non-numerical indicators.

10. The user interface of claim 7, wherein the plurality of holes have been bored through the single-sided printed circuit board to form a plurality of seven-segment displays.

11. The user interface of claim 7, wherein the plurality of holes have been bored through the single-sided printed circuit board to form a numeric display portion and a non-numeric display portion.

12. A user interface of a home appliance comprising:

a single-sided printed circuit board within the home appliance, wherein a plurality of holes have been partially bored into a non-component side of the single-sided printed circuit board;

a plurality of reverse-mount light emitting diodes respectively mounted into the plurality of partially bored holes, wherein the plurality of reverse-mount light emitting diodes are positioned so as to respectively shine light out of the plurality of partially bored holes;

a light guide adjacent to the non-component side of the single-sided printed circuit board;

a diffuser screen adjacent to the light guide; and a film disposed upon the diffuser screen.

13. The user interface of claim 12, wherein at least a portion of the plurality of reverse-mount light emitting diodes serve as a plurality of non-numerical indicators.

14. The user interface of claim 12, wherein the plurality of holes are arranged to form a plurality of seven-segment displays.

15. The user interface of claim 12, wherein the plurality of holes are arranged to form a numeric display portion and a non-numeric display portion.

\* \* \* \* \*